United States Patent
Yang et al.

(10) Patent No.: US 9,892,802 B1
(45) Date of Patent: Feb. 13, 2018

(54) HARDWARE ASSISTED SCHEME FOR TESTING MEMORIES USING SCAN

(71) Applicant: Apple Inc., Cupertino, CA (US)

(72) Inventors: Bo Yang, Santa Clara, CA (US);
Andrew J. Copperhall, Redwood City, CA (US); Bibo Li, San Jose, CA (US);
Vijay M. Bettada, Fremont, CA (US)

(73) Assignee: Apple Inc., Cupertino, CA (US)

( * ) Notice: Subject to any disclaimer, the term of this patent is extended or adjusted under 35 U.S.C. 154(b) by 308 days.

(21) Appl. No.: 14/714,381

(22) Filed: May 18, 2015

(51) Int. Cl.
*G11C 29/10* (2006.01)
*G01R 31/3177* (2006.01)
*G11C 29/50* (2006.01)

(52) U.S. Cl.
CPC .......... *G11C 29/10* (2013.01); *G01R 31/3177* (2013.01)

(58) Field of Classification Search
CPC ............... G11C 29/10; G01R 31/3177; G01R 31/318533; G01R 31/318536; G01R 31/318541; G01R 31/318544
See application file for complete search history.

(56) References Cited

U.S. PATENT DOCUMENTS

| | | | |
|---|---|---|---|
| 6,505,281 B1 * | 1/2003 | Sherry | G06F 3/0613 709/208 |
| 7,152,194 B2 | 12/2006 | Vinke et al. | |
| 7,721,174 B2 | 5/2010 | Cheng et al. | |
| 7,869,293 B2 | 1/2011 | Morein | |
| 8,028,209 B2 | 9/2011 | Li et al. | |
| 8,589,749 B1 * | 11/2013 | Yu | G01R 31/318597 714/729 |
| 8,711,645 B2 | 4/2014 | Chakravarty | |
| 2005/0268185 A1 * | 12/2005 | Vinke | G11C 29/32 714/718 |

* cited by examiner

*Primary Examiner* — April Y Blair
*Assistant Examiner* — Dipakkumar Gandhi
(74) *Attorney, Agent, or Firm* — Meyertons, Hood, Kivlin, Kowert & Goetzel, P.C.; Erik A. Heter

(57) ABSTRACT

A hardware assisted scheme for testing IC memories using scan circuitry is disclosed. An IC includes a memory implemented thereon and a chain of serially-coupled scan elements to enable the inputting of test vectors. The scan elements include first and second subsets forming write and read address registers, respectively, a first control flop, and a second control flop. During a launch cycle of a test operation, a first address loaded into the write address register is provided to a write address decoder to effect a write operation. Also responsive to the launch cycle, the first control flop is configured to cause the first address to be provided to the read address register, while the second control flop causes data to be written into the memory. During a capture cycle, the first address is provided to a read address decoder and the second control flop causes a read of data therefrom.

15 Claims, 6 Drawing Sheets

HARDWARE ASSISTED SCHEME FOR TESTING MEMORIES USING SCAN

BACKGROUND

Technical Field

This disclosure is directed to integrated circuits (ICs), and more particularly, to the testing of memories on IC's.

Description of the Related Art

The testing of integrated circuits (ICs) provides a number of challenges. Among these challenges is to provide access to internal circuits and circuit nodes that are not otherwise accessible externally.

One approach to gaining access to internal circuits/nodes is through the use of scan chains. A scan chain is effectively a shift register having a number of serially-coupled elements in which data bits are shifted from one element to the next. Test stimulus may be input into an IC under test through a scan chain and applied to the functional circuits therein. After the test stimulus has been applied, results may be captured by scan elements of the scan chain and shifted out from the IC under test for comparison with expected results.

Another approach to gaining access to internal circuits/nodes is to implement built-in self-test (BIST) circuitry. Tests may be conducted by the BIST circuitry on various internal circuits, with the results of the tests being conveyed to external pins of the IC under test.

SUMMARY

A hardware assisted scheme for testing IC memories using scan circuitry is disclosed. In one embodiment, an IC includes a memory implemented thereon, such as a latch array RAM. The IC also includes a chain of serially-coupled scan elements to enable the inputting of test vectors. The scan elements includes a first subset forming a write address register, a second subset forming a read address register, a first control flop, and a second control flop. During a launch cycle of a scan test operation, a first address loaded into the write address register is provided to a write address decoder to effect a write operation. Also responsive to the launch cycle, the first control flop is configured to cause the first address to be provided to the read address register, while the second control flop causes data to be written into the memory. During a capture cycle, the first address is provided to a read address decoder from the read address register, and the second control flop causes a read of data from the first address.

In various embodiments, a method includes writing data to a designated address responsive to a launch cycle of a scan-based test, and reading data from the designated address responsive to a capture cycle of the scan based test. Circuitry may be implemented on the IC to cause the designated address to be conveyed from a write address register to a read address register. The data read from the designated address may be captured into scan elements and subsequently shifted from the IC for analysis.

BRIEF DESCRIPTION OF THE DRAWINGS

The following detailed description makes reference to the accompanying drawings, which are now briefly described.

Figure 1:
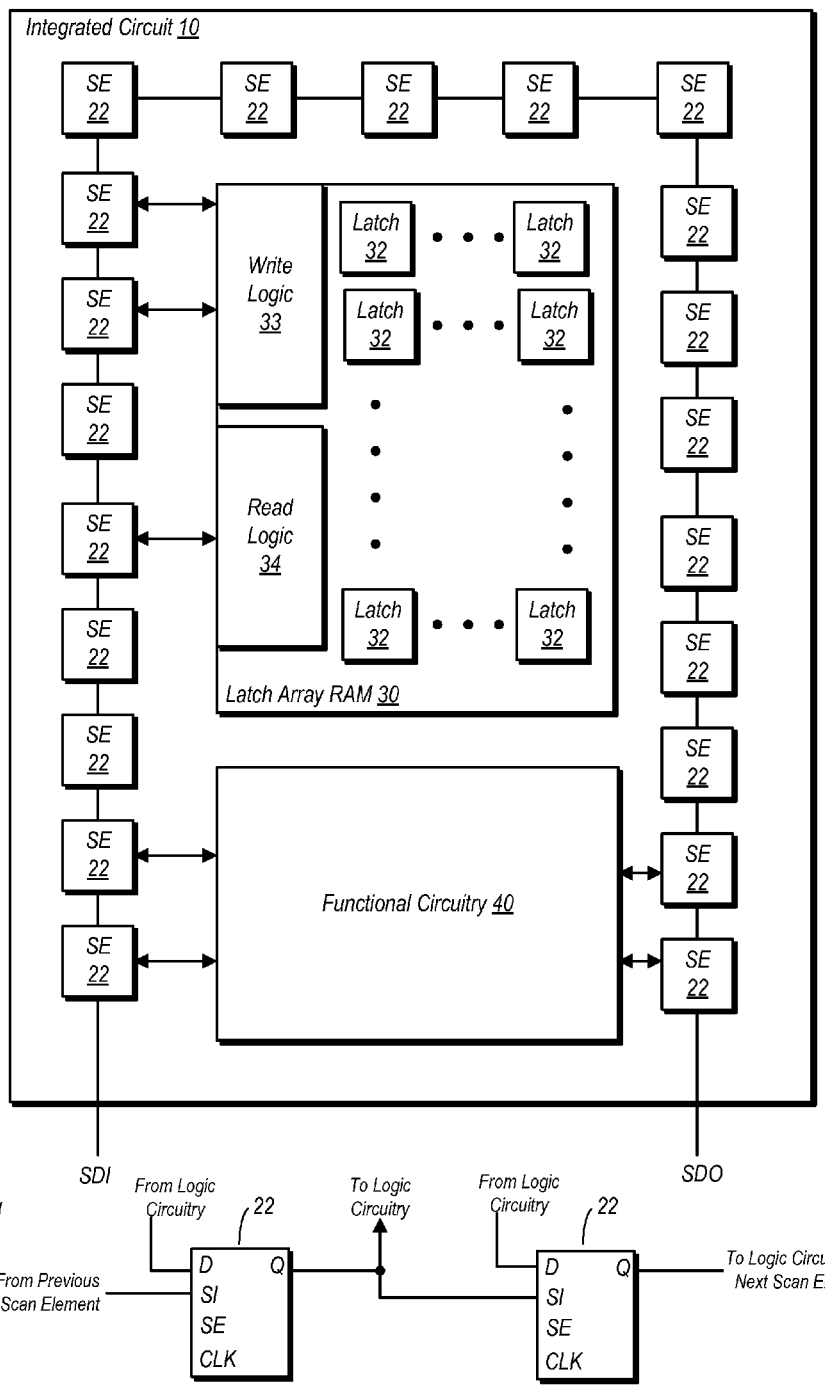
FIG. 1 is a block diagram of one embodiment of an IC including a latch array RAM.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) (or pre-AIA paragraph six) interpretation for that unit/circuit/component.

DETAILED DESCRIPTION OF EMBODIMENTS

Turning now to FIG. 1, a block diagram of one embodiment of an IC including a latch array RAM is shown. IC 10 shown in FIG. 1 is for illustrative purposes, and is not intended to be limiting.

In the embodiment shown, IC 10 includes a latch array RAM 30 and functional circuitry 40. Latch array RAM 30 as shown here is implemented using a number of latches 32, which are arranged to form unique addresses. Latch array RAM 30 includes write logic 33, which in turn includes a write address decoder and other logic circuitry for supporting write operations. Read logic 34 includes a read address decoder and other logic circuitry for supporting read operations. IC 10 also includes functional circuitry 40. Such circuitry may include virtually any type of circuitry used to process digital information, including (but not limited to) execution units, digital filters, interface circuitry, and so on. During normal operations, functional circuitry 40 may communicate with latch array RAM 30 for storage and retrieval of information used in carrying out its various functions. Although not explicitly shown, latch array RAM 30 also includes connections for receiving data to be written (i.e. a write port) and outputting data that has been read (i.e. a read port). It is noted that the circuitry discussed below is scalable, and thus may be implemented to conduct tests in accordance with this disclosure for latch array RAMs (or other memory types) have multiple read and/or write ports.

It is noted that while the memory implemented on the illustrated embodiment of IC 10 is latch array RAM 30, other memory types are also possible and contemplated (e.g., dynamic RAM, static RAM, and so on). Such other memory types may be included in various embodiments of an IC in conjunction with or in lieu of latch array RAM 30.

IC 10 in the embodiment shown also includes a scan chain made up of a number of serially coupled scan elements 22. An illustrative connection between two exemplary scan elements 22 is shown at the bottom of the drawing. The scan chain may effectively be considered as a large shift register having the capability to shift data from the Q output of one scan element 22 to the scan input SI of a next scan element 22. During scan operations, test stimulus data may be shifted into IC 10, via the scan data input SDI, through the scan chain when a scan element (SE') signal is asserted. The test stimulus data may be applied to the various internal circuits during a launch cycle initiated by a clock pulse received on each of the scan elements while the SE signal is de-asserted.

Circuits may receive the test stimulus data from the Q output of a correspondingly coupled scan element 22. During a capture cycle, initiated by a clock pulse subsequent to the one that initiated the launch cycle, test result data may be captured by each o element 22 through its respective D input. After capturing test result data, the SE signal may be re-asserted and the data may be shifted from the IC through the scan chain, exiting IC 10 at the scan data output SDO. The test result data may be received by an external location where it can then be analyzed to determine pass/fail status and other information.

The scan elements 22 of the scan chain may be used to support testing of latch array RAM 30 in the embodiment shown. With an addition of a small amount of circuitry, read and write operations involving latch array RAM 30 may be supported using specific instances of scan elements 22. Accordingly, the use of such circuitry may obviate the need for built-in self-test (BIST) circuitry used to test latch array RAMs and other types of memories in prior art embodiments. The use of scan elements to support testing of latch array RAM 30 as discussed herein and the elimination of memory BIST circuitry from IC 10 for testing this particular memory may significantly reduce the overall test footprint. In general, the amount of logic circuitry used to support a memory BIST testing may be significantly greater than the amount of logic used to support scan test operations for latch array RAM 30.

Figure 2:
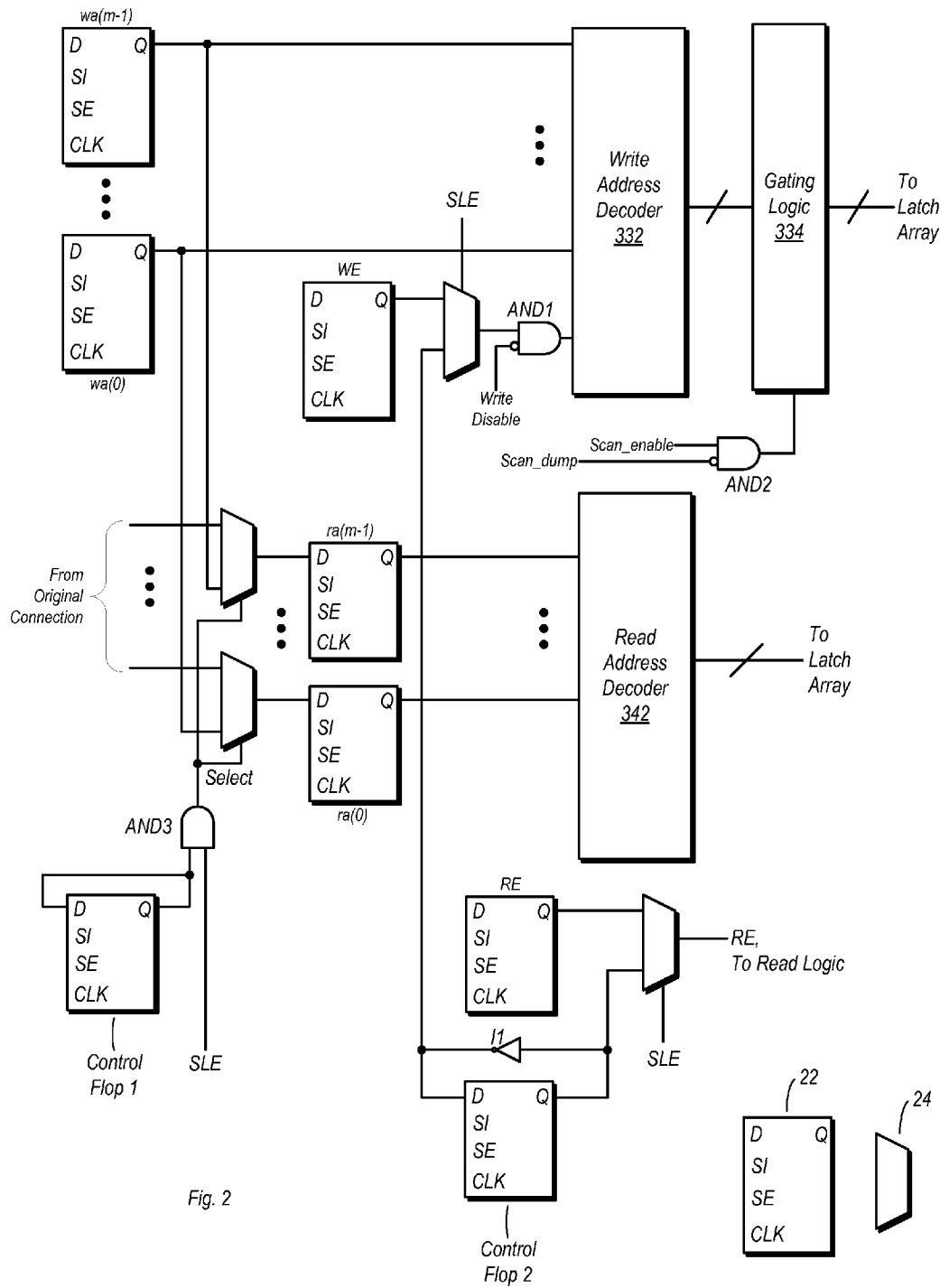
FIG. 2 is a logic diagram illustrating added circuits to enable scan elements to support testing of a memory such as a latch array RAM.

FIG. 2 is a logic diagram illustrating added circuits to enable scan elements to support testing of a memory such as latch array RAM 30. In the illustrated example, a first subset of scan elements 22 form a write address register and are coupled to provide an address to write address decoder 332 (which is part of write logic 33 shown in FIG. 1). The address for latch array RAM 30 includes m bits, and thus the subset of scan elements 22 that make up the write address register includes write address bits wa(m−1:0).

A second subset of scan elements 22 forms a read address register that is coupled to provide an address to read address decoder 342 (which is part of read logic 34 shown in FIG. 1). Each scan element 22 of the subset forming the read address register is coupled to receive a respective address bit via a multiplexer 24. During normal operations, the select ('Select') is de-asserted and thus each scan element 22 of the read address register receives an address bit from an original connection (e.g., from circuitry configured to issue read address). During certain test operations, 'Select' is asserted (from the output of AND3), and thus each scan element 22 of the read address register may receive its respective address bit from the Q output of a corresponding one of scan elements 22 of the write address register. For example, the scan element labeled ra(m−1) may receive a corresponding address bit from the scan element labeled wa(m−1). This operation is explained in further detail below.

Two of the scan elements 22 shown in FIG. 2 function as control flops, and as such are labeled Control Flop 1 and Control Flop 2. Control Flop 1 in the embodiment shown is configured to control the state of the 'Select' signal when another signal, (scan latch enable, or SLE) is asserted. Furthermore, since the D input of Control Flop 1 is coupled to the Q output of the same in this embodiment, it may hold its current state for successive clock cycles.

Control Flop 2 in the embodiment shown is configured to control respective states of write and read enable signals. During normal operations, the write enable signal may originate at the scan element 22 labeled WE, and be provided to write address decoder 332 via the correspondingly coupled multiplexer 24 and AND gate AND1, when the write disable signal is de-asserted. Similarly, during normal operation, the read enable signal may originate at the scan element 22 labeled RE and may be provided to read logic 34 via the correspondingly coupled multiplexer 24 shown in the drawing. During those test operations when SLE is asserted, the write and read enable signals originate with Control Flop 2, and may be provided to write address decoder 332 and read logic 34 via the respectively coupled multiplexers noted above. Inverter I1, coupled between the Q output and D input of Control Flop 2, ensures that the write and read enable signals are in opposite states in this embodiment. This configuration also causes the Q output and the D input to change states with each clock cycle.

The circuitry described above with reference to FIG. 2 may facilitate testing of the latch array RAM 30 shown in FIG. 1. It is also possible and contemplated that similar types of circuitry may be implemented to test other types of memory implemented on an IC. In the illustrated embodiment, the various scan elements 22 may be loaded with certain data to initiate a test in which data is written to a particular address on a first cycle (e.g., the launch cycle) and read from the same address on a subsequent second cycle (e.g. a capture cycle). The data read from the address may be captured into other scan elements 22 (not shown for the sake of simplicity) via a read port of latch array RAM 30. Thereafter, the captured data may be shifted out of IC 10 to determine if the data read from latch array RAM 30 was the same as that which was written thereto.

To conduct a test as described in the previous paragraph, a target address may be shifted into the subset of scan elements 22 that form the write address register, a logic 1 may be shifted into Control Flop 1, while a logic 0 may be shifted into Control Flop 2. Since the address to which data is to be written is the same as that as from which data is to be read, the initial values shifted into the scan elements 22 forming the read address register do not matter for write-read tests (i.e. write to an address followed by a read of the address). Similarly, since Control Flop 2 controls the states of the read and write enable signals during this test, the values shifted into the scan elements 22 labeled WE and RE are irrelevant during this test. Additionally, data that is to be written into latch array RAM 30 during the test may be loaded into a data register made up of a number of scan elements 22 (not shown for the sake of simplicity), if one is present.

Once the test stimulus has been loaded into appropriate scan elements 22, the scan enable signal SE may be de-asserted, while the scan latch enable signal SLE may be asserted. Assertion of the SLE signal indicates that testing is to be conducted. Subsequent to assertion of the SLE signal, a first clock pulse may be provided to the scan elements 22, initiating the launch cycle. Responsive to initiating the launch cycle, the write address is provided to write address decoder 332. Since Control Flop 2 is initially is loaded with a logic 0, the clock pulse initiating the launch cycle causes the Q output to provide a logic 0, and thus causes a logic 1 to be provided from the output of I1. This logic 1 is thus provided through the corresponding multiplexer 22 and AND1 to write address decoder 332. Thus, receiving both a write address and an asserted write enable signal at write address decoder 332, data is written to the designated address.

In addition to the write address decoder 332, the scan elements 22 that make up the read address register also receive address bits from corresponding scan elements 22 of the write address register, via the multiplexers 24 coupled there between. As previously noted, the Select signal is asserted from AND3 due to a logic 1 output from Control Flop 1 and the assertion of the SLE signal. Accordingly, the write address is routed to the scan elements forming the read address register, as well as to the write address decoder during the launch cycle.

The next, subsequent clock pulse asserted initiates the capture cycle. Responsive to initiating the capture cycle, the address loaded into the scan elements 22 of the read address register during the launch cycle are now provided to read address decoder 342. Meanwhile, the output Q of Control Flop 2 changes from a logic 0 to a logic 1 due to the corresponding change (caused by inverter I1) occurring on the D input during the launch cycle. Accordingly, with a read address provided to read address decoder 342 and a read enable signal provided to read logic 34, a read of data is conducted. Assuming correct functioning of the various circuitry shown in FIG. 2, the address from which data is read will be the same as the data to which address was written. The data read from the latch array RAM 30 (or other memory) may be captured into other scan elements 22 (not shown) and subsequently shifted from IC 10 for analysis.

Table 1 is presented below to show the various test modes that are enabled by the circuitry described above. The testing procedure described above corresponds to Scan Cap mode 2 as shown in Table 1.

TABLE 1

| Modes | SLE | ACF1 | ACF2 | Description |
|---|---|---|---|---|
| Functional mode | 0 | X | X | Test logic disabled |
| Scan Cap mode 1 | 1 | 0 | X | Cover functional D con of RA. |
| Scan Cap mode 2 | 1 | 1 | 0(0--->1) | Main mode to get coverage. |
| Scan Cap mode 3 | 1 | 1 | 1(1--->0) | Only s@ coverage on data paths |

In addition to the Scan Cap mode 2 testing described above, two other test modes are enabled by the circuitry of FIG. 2. In Scan Cap mode 1, Control Flop 1 is loaded with a logic 0, thereby causing de-assertion of the Select signal provided to the multiplexers that are coupled to the inputs of those scan elements 22 making up the read address register. Accordingly, the original, functional source of the read address may be tested by capturing data into the scan elements 22 of the read address register.

In Scan Cap mode 3, the logic shown in FIG. 2 may create read-write operations on launch and capture cycles, respectively. If all of the latch cells of latch array RAM 30 are loaded with initial values, this mode could enable the detection of stuck-at coverage on the D input and Q output of the various latch cells. No coverage is provided on decoder logic in this mode, as the rows may be initialized to the same value.

It is noted that in at least some embodiments, the testing described above may be conducted at-speed, i.e. at a clock speed commensurate with that of normal operations. Thus, the clock pulses that initiate the launch and capture cycles may be provided at a frequency that corresponds to at least one operational clock frequency for the involved circuitry.

Figure 3:
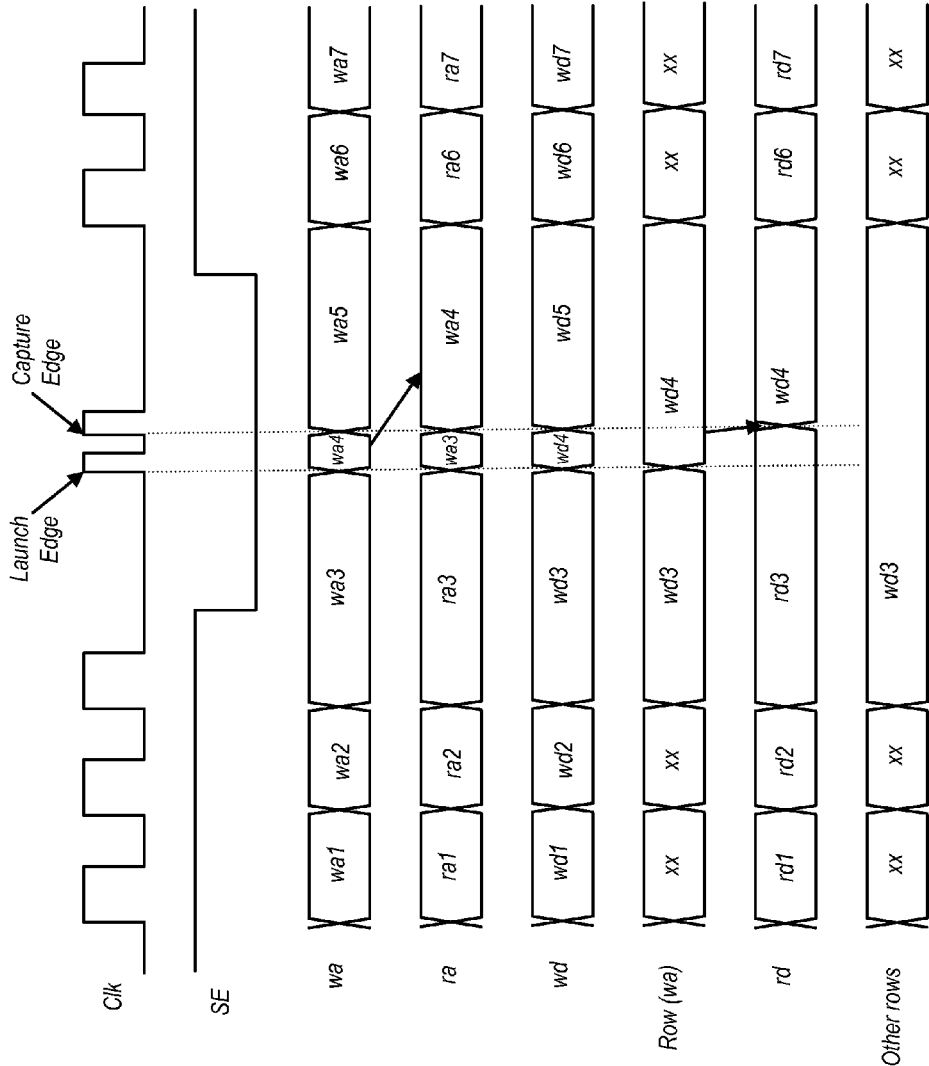
FIG. 3 is a timing diagram illustrating operation of one embodiment of the circuitry shown in FIG. 2.

FIG. 3 is a timing diagram illustrating operation of one embodiment of the circuitry shown in FIG. 2. In particular, the timing diagram shown in FIG. 3 corresponds to the operation in Scan Cap mode 2 as described above. In this mode, the write address is captured as the read address during the capture cycle and provided to the read address decoder to effect a read operation. Prior to beginning the testing, data is scanned into IC 10 through the scan chain by shifting each bit of the test input data from one scan element to the next until it has reached its final destination. This is done under the control of the clock signal, and with the scan enable signal SE asserted. Each scan element 22 as discussed above is configured to load data received through its scan input SI when the scan enable signal is asserted. Once the test input data has been fully loaded, the scan enable signal is de-asserted.

In the illustrated example, a write address wa4 is loaded responsive to the clock edge of the launch cycle (launch Edge'). When loaded, this address is also provided to the write address decoder 332, and the write data wd4 is written into the latch array RAM 30 at the designated address, which includes writing to the row corresponding to the write address. The write address wa4 is also provided, during the launch cycle (which begins at the launch edge and continues to the beginning of the capture cycle 'Capture Edge) to the inputs of the scan elements 22 that make up the read address register, but are not yet loaded. Furthermore, at the launch edge, the read enable signal remains inactive (de-asserted), and thus the data provided from the read port, rd3, remains.

Upon initiating the capture cycle at the Capture Edge, the write address wa4 is captured into the scan elements 22 of the read address register and provided to the read address decoder 342. Concurrently, the read enable signal is asserted, and thus a read of data wd4 from the designated address is performed. The data read from this address may be captured into other scan elements 22. At some point in time after the read operation is complete, the scan enable signal is once again asserted and shift operations recommence in order to shift the captured test result data from IC 10.

Figure 4:
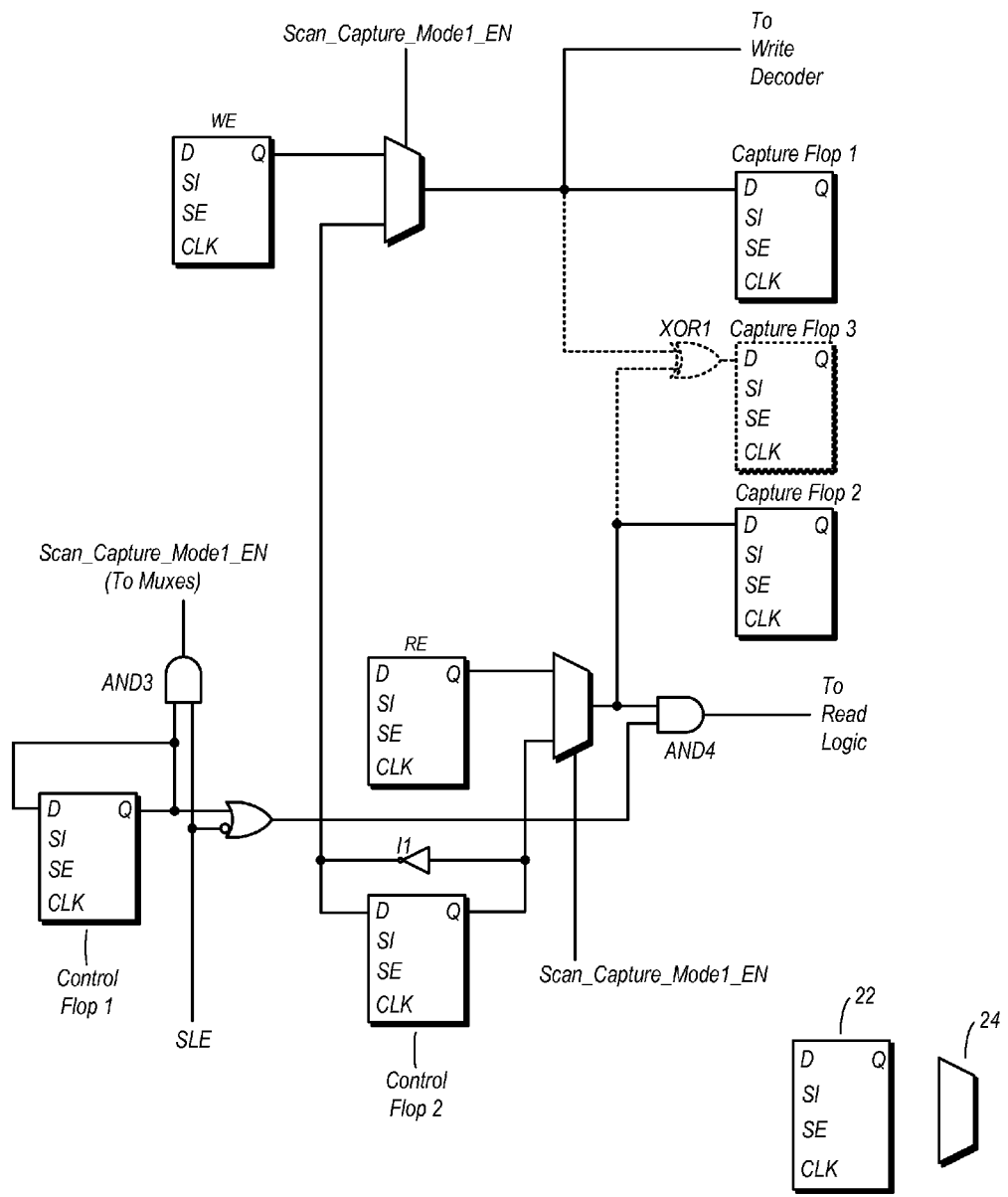
FIG. 4 is a logic diagram illustrating additional circuitry to enable scan test capture of read and write enable signals.

FIG. 4 is a logic diagram illustrating additional circuitry to enable scan test capture of read and write enable signals. In the embodiment shown, the multiplexers 24 have been altered such that their respective select signals are not the SLE signal, but instead are the Scan Capture_Model_EN signal, which is generated from the output of AND3. The output of Control Flop 1 and the SLE signal are inputs to AND3, and thus Scan Capture_Model_EN is active when both of the input signals are asserted. The circuitry shown also includes extra scan elements 22 labeled here as Capture Flop 1, Capture Flop 2, and Capture Flop 3. It is noted that one or more of these extra scan elements is optional, and thus they may be implemented in various combinations.

Capture Flop 1 in the embodiment shown is coupled to capture the write enable signal, while Capture Flop 2 is coupled to capture the read enable signal. To observe the respective values of these two signals as output from their corresponding flops WE and RE, Control Flop 1 may be loaded with a logic 0. The flops WE and RE may be loaded with desired values. As an alternative to using Capture Flops 1 and 2, an embodiment could also implemented using Capture Flop 3 and exclusive OR gate XOR1. This may allow the effective capture of both the write enable and read enable signal states based on known values that were loaded with the test stimulus. Moreover, any combination of Capture Flops 1, 2, and 3 and associated circuitry could be added to effectively capture the states of the write and read enable signals.

The added circuitry may allow automated test program generation (ATPG) tools to generate tests to capture the states of these signals, as well as performing the other tests discussed above. In general, the various embodiments of circuitry discussed above with respect to FIG. 2 and FIG. 4 may enable ATPG to generate a number of different test scenarios to fully exercise the circuitry associated with the latch array RAM 30 (or other memory) as well as associated supporting circuitry, such as the address registers.

Figure 5:
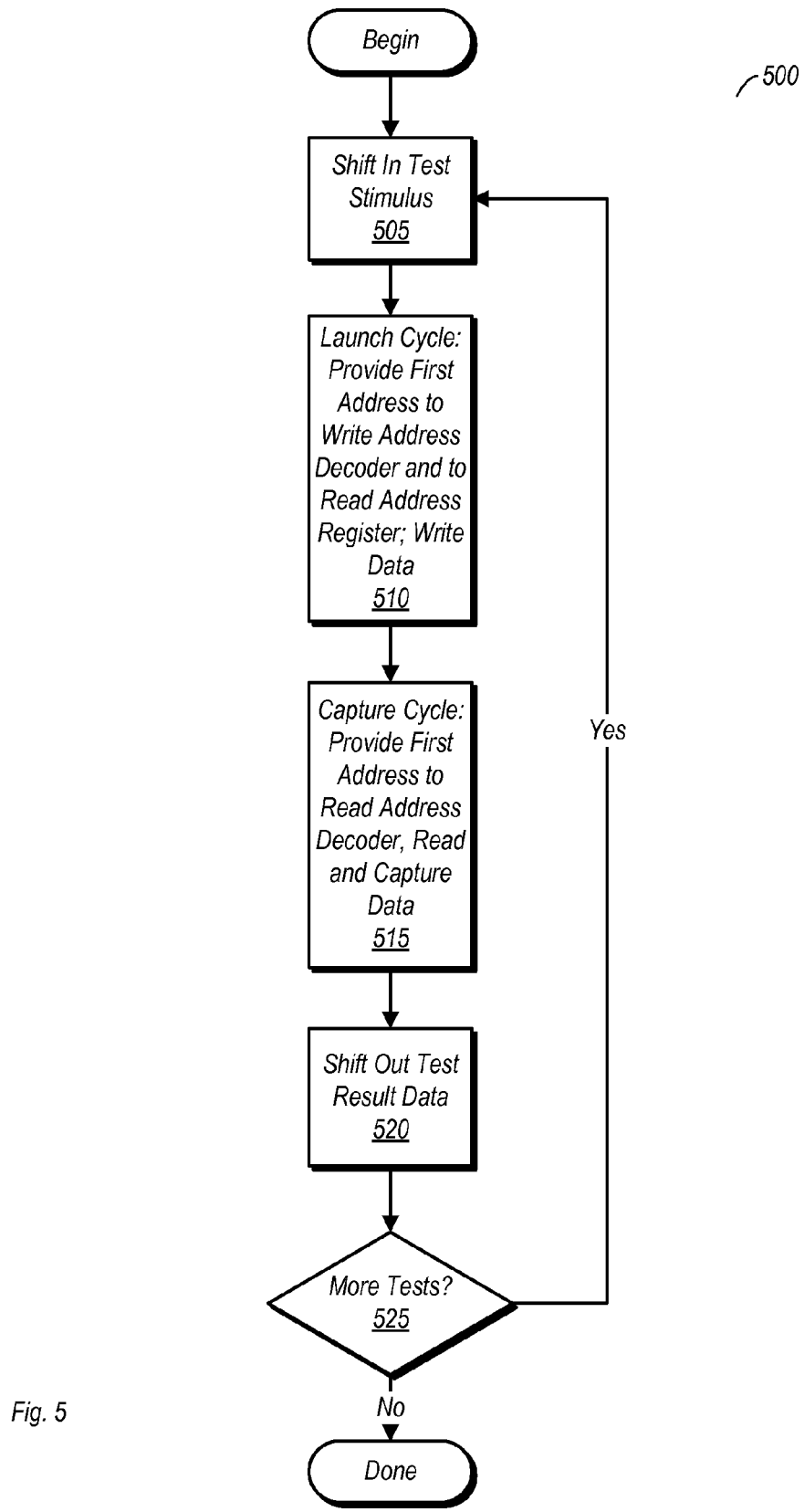
FIG. 5 is a flow diagram illustrating one embodiment of a method for testing a memory on an IC.

FIG. 5 is a flow diagram illustrating one embodiment of a method for testing a memory on an IC. Method 500 as discussed herein may be performed using various embodiments of the circuitry discussed above. It is further possible and contemplated that method 500 can be performed with circuit embodiments not explicitly discussed herein. Furthermore, while method 500 is directed to one specific type of testing (writing to an address and subsequently reading therefrom), the circuitry discussed above is not limited to performing testing in this manner.

Method 500 begins with the shifting in of test stimulus (block 505). The test stimulus may include addresses, data, and various other control signal states that are generated using ATPG. Upon completion of the initial shift operations to load the test stimulus, a first clock pulse may initiate a launch cycle (block 510). In the launch cycle, a first address is provided to the write address decoder, along with a write enable signal. Accordingly, data is written to the first address. Additionally, the first address is provided to inputs of a read address register.

Subsequent to the launch cycle, the next clock pulse initiates a capture cycle (block 515). During the capture cycle, the first address is provided from the read address register to the read address decoder, along with a read enable signal. Responsive thereto, a read of data from the first address is performed. The data read from the first address may be captured into scan elements coupled to a read port of the memory.

Upon completion of the read, the test result data may be shifted out from the IC for external storage and analysis (block 520). If more test are to be conducted (block 525, yes), the method returns to block 505. If no more tests are to be conducted (block 525, no), then method 500 is complete.

Figure 6:
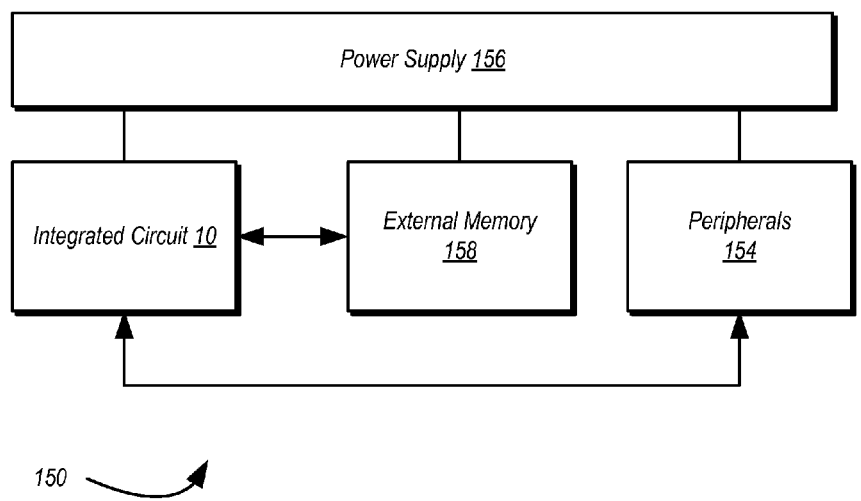
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a scan chain having a plurality of scannable flop circuits including a first subset of scannable flop circuits, a second subset of scannable flop circuits, a first control flop circuit, and a second control flop circuit; and
   a latch array random access memory (RAM) having a plurality of latches as storage elements, wherein the latch array is organized into a plurality of addresses each including a corresponding subset of the plurality of latches, and wherein the latch array further includes:
      a write address decoder coupled to the first subset of scannable flop circuits and configured to decode and select one of the plurality of addresses during a write operation; and
      a read address decoder coupled to the second subset of scannable flop circuits and configured to decode and select one of the plurality of addresses during a read operation;
   wherein, during a scan test operation:
      the first subset of scannable flop circuits provide a first address to the write address decoder on a launch cycle and provide the first address to the read address decoder on a capture cycle, wherein a write enable signal is provided to the write address decoder responsive to the launch cycle and a read enable signal is provided to the latch array RAM responsive to the capture cycle; and data is written to the first address responsive to the launch cycle and data is read from the first address responsive to the capture cycle, wherein the plurality of scannable flop circuits includes a first capture flop circuit coupled to capture a state of the write enable signal and a second capture flop circuit coupled to capture a state of the read enable signal.

2. The integrated circuit as recited in claim 1, wherein the first address is provided to the second subset of scannable flop circuits responsive to the launch cycle.

3. The integrated circuit as recited in claim 2, further comprising a first plurality of multiplexers each having an output coupled to an input corresponding to one of the second subset of scannable flop circuits, wherein each of the first plurality of multiplexers further includes a respective first input coupled to a corresponding one of the first subset of scannable flop circuits and a respective second input, wherein the first control flop circuit is configured to cause each of the first plurality of multiplexers to select its respective first input during the scan test operation.

4. The integrated circuit as recited in claim 3, wherein each of the first plurality of multiplexers is configured to select its respective second input responsive to de-assertion of a scan latch array enable signal.

5. The integrated circuit as recited in claim 1, wherein assertion of the read enable signal is inhibited to the latch array RAM during the launch cycle and assertion of the write enable signal to the write address decoder is inhibited during the capture cycle.

6. The integrated circuit as recited in claim 1, further comprising an exclusive-OR (XOR) gate having a first input coupled to receive the write enable signal and a second input coupled to receive the read enable signal, and wherein the plurality of scannable flop circuits includes a scannable flop circuit coupled to receive an output from the XOR gate.

7. The integrated circuit as recited in claim 1, further comprising a first AND gate configured to inhibit writing to the latch array RAM responsive to assertion of a write disable signal, and a second AND gate configured to inhibit writing to the latch array RAM responsive to assertion of a scan dump signal.

8. A method comprising:
shifting test stimulus data into an integrated circuit via a scan chain implemented therein, the scan chain including a plurality of scannable flop circuits including a first subset of scannable flop circuits, a second subset of scannable flop circuits, a first control flop circuit, and a second control flop circuit;

writing data to a first address of a latch-array random access memory (RAM) on a launch cycle, wherein said writing includes providing the first address from the first subset of scannable flop circuits to a write decoder of the latch array RAM and further comprises providing a write enable signal to the latch array RAM and inhibiting a read enable signal from being provided to the latch array RAM during the launch cycle;

providing the first address to the second subset of scannable flop circuits during the launch cycle, wherein providing the first address to the second subset of scannable flop circuits includes the first control flop circuit causing the first address to be routed to the second subset of scannable flop circuits;

providing the first address from the second subset of scannable flop circuits to a read address decoder of the latch array RAM;

reading data from the first address of the latch array RAM during a capture cycle, wherein reading data includes providing the read enable signal to the latch array RAM and inhibiting the write enable signal from being provided to the latch array RAM during the capture cycle;

providing the write enable signal to a first capture flop circuit and the read enable signal to a second capture flop circuit, the first and second capture flop circuits being included in the plurality of scannable flop circuits.

9. The method as recited in claim 8, further comprising providing the write enable signal to a first input of an exclusive OR (XOR) gate and the read enable signal to a second input of the XOR gate, and further comprising providing an output from the XOR gate to a capture flop circuit, the capture flop circuit be one of the plurality of scannable flop circuits.

10. The method as recited in claim 8, further comprising selecting outputs from each of the first subset of scannable flop circuits to be provided respective inputs of corresponding ones of the second subset of scannable flop circuits.

11. The method as recited in claim 10, further comprising, responsive to de-assertion of a scan latch array enable signal, inhibiting the selection of outputs from each of the first subset of scannable flop circuits to be provided respective inputs of corresponding ones of the second subset of scannable flop circuits.

12. The method as recited in claim 8, further comprising:
inhibiting writing to the latch array RAM responsive to assertion of a write disable signal; and
inhibiting writing to the latch array RAM responsive to assertion of a scan dump signal.

13. An integrated circuit comprising: a random access memory (RAM), wherein the RAM is organized into a plurality of addresses, and wherein the RAM includes a write address decoder and a read address decoder; a scan chain having a plurality of scan elements, wherein the plurality of scan elements includes a first subset coupled to provide a write address to the RAM, a second subset of scan elements coupled to provide a read address to the RAM, and first and second control flops; and a plurality of multiplexers each coupled between a respective output of a one of the first subset of scan elements and a respective input of a corresponding one of the second subset of scan elements; wherein, during a test mode, the first control flop is configured to cause assertion of a selection signal provides to each of the plurality of multiplexers such that a first address is conveyed from the first subset of scan elements to the second subset of scan elements and the second control flop is configured to cause data to be written to the first address during a launch cycle and data to be read from the first address on a capture cycle subsequent to the launch cycle and wherein, during the test mode, the second control flop is configured to cause assertion of a write enable signal provided to the write address decoder during the launch cycle, and further configured to cause assertion of a read enable signal provided to the RAM during the capture cycle and concurrent with providing the first address from the second subset of scan elements to the read address decoder, wherein the second control flop is further configured to inhibit the read enable signal from being asserted during the launch cycle and inhibit the write enable signal from being asserted during the capture cycle.

14. The integrated circuit as recited in claim 13, further comprising:
- a first AND gate configured to inhibit assertion of the write enable signal responsive to assertion of a write disable signal; and
- a second AND gate configured to inhibit writing to the RAM responsive to assertion of a scan dump signal.

15. The integrated circuit as recited in claim 13, wherein the RAM is a latch array RAM having a plurality of latches as storage elements, wherein each of the plurality of addresses comprises a corresponding subset of the plurality of latches.

\* \* \* \* \*